United States Patent
McKinstry et al.

(10) Patent No.: US 7,378,782 B2
(45) Date of Patent: May 27, 2008

(54) IDT ELECTRODED PIEZOELECTRIC DIAPHRAGMS

(75) Inventors: Susan Trolier McKinstry, State College, PA (US); Euniki Hong, State College, PA (US); Carl Baldwin Freidhoff, New Freedom, PA (US); Silai V Krishnaswamy, Monroeville, PA (US)

(73) Assignees: The Penn State Research Foundation, University Park, PA (US); Northrup Grumman Corp., Los Angeles, CA (US)

( * ) Notice: Subject to any disclaimer, the term of this patent is extended or adjusted under 35 U.S.C. 154(b) by 226 days.

(21) Appl. No.: 10/996,604

(22) Filed: Nov. 26, 2004

(65) Prior Publication Data

US 2006/0186761 A1   Aug. 24, 2006

Related U.S. Application Data

(60) Provisional application No. 60/525,632, filed on Nov. 26, 2003.

(51) Int. Cl.
*H01L 41/047* (2006.01)
*H01L 41/18* (2006.01)
*H01L 41/187* (2006.01)

(52) U.S. Cl. .................. 310/369; 310/324; 310/363; 310/364; 310/365; 310/313 B

(58) Field of Classification Search .............. 310/324, 310/363–366, 313 B, 369
See application file for complete search history.

(56) References Cited

U.S. PATENT DOCUMENTS

| 4,453,242 A | | 6/1984 | Toda |
|---|---|---|---|
| 4,688,306 A | * | 8/1987 | Soni et al. ............... 29/25.35 |
| 5,386,115 A | | 1/1995 | Freidhoff et al. |
| 5,466,932 A | | 11/1995 | Young et al. |
| 5,852,337 A | * | 12/1998 | Takeuchi et al. ............. 310/324 |
| 6,323,580 B1 | * | 11/2001 | Bernstein ..................... 310/324 |
| 6,583,688 B2 | | 6/2003 | Klee et al. |
| 6,597,084 B2 | * | 7/2003 | Hu et al. ..................... 310/357 |
| 6,661,162 B1 | | 12/2003 | Nagai et al. |

(Continued)

FOREIGN PATENT DOCUMENTS

JP    02 185239    7/1990

(Continued)

OTHER PUBLICATIONS

Hong et al, Fabrication of Piezoelectric diaphragm using Lead Zirconate Titanate (PZT) Films, Mat. Res. Soc. Symp. Proc. vol. 687, 2002.

(Continued)

*Primary Examiner*—Jaydi A San Martin
(74) *Attorney, Agent, or Firm*—Law Offices of John A. Parrish

(57) ABSTRACT

The disclosed invention relates to achieving micromachined piezoelectrically-actuated diaphragms. The piezoelectric diaphragm includes a central, inactive electrode free region and an annular shaped interdigitated electrode adjacent to the outer periphery of the central region. The diaphragm also may have an inactive annular, electrode free region and an active central, interdigitated electrode region. The diaphragms may be used in, such as, miniature pumps. The pumps may include a plurality of chambers to generate peristaltic pumping of fluids.

24 Claims, 1 Drawing Sheet

U.S. PATENT DOCUMENTS

| | | | |
|---|---|---|---|
| 2002/0071172 A1 | 6/2002 | Naiki | |
| 2002/0123158 A1* | 9/2002 | Murai | 438/3 |
| 2002/0189375 A1* | 12/2002 | Takeuchi et al. | 73/865 |
| 2003/0025422 A1* | 2/2003 | Watanabe et al. | 310/348 |
| 2003/0173873 A1* | 9/2003 | Bryant et al. | 310/365 |
| 2004/0086740 A1* | 5/2004 | Fujimoto et al. | 428/597 |
| 2006/0273687 A1* | 12/2006 | Fujimoto et al. | 310/313 R |

FOREIGN PATENT DOCUMENTS

| | | |
|---|---|---|
| JP | 11 349379 | 12/1999 |

OTHER PUBLICATIONS

Hong et al, Fabrication of Micromachined Piezoelectric diaphragm pumps actuated by interdigitated transducer electrodes, Mat. Res. Soc. Symp. Proc. vol. 741, May 2003.

Hong et al., Design of MEMS PZT Circular Diaphragm Actuators to Generate Large Deflections.

Hong et al, Micromachined piezoelectric diaphragms actuated by ring shaped interdigitated transducer electrodes, Sensors and Actuators, J. Sensors & Actuators.

Takahashi et al, "Electro-Mechanical Properties Of PbZrO3 -PbTiO3 -Pb(Mnh/3Sb2/3)03 Ceramics Under Vibration-Level Change", Mat. Res. Soc. Symp. Proc. vol. 350 © 1995 Materials Research Society, pp. 305-310.

Wu et al, "Effect of Rare-Earth Oxide On The Properties Of Piezoelectric Ceramics," Ferroelectrics, 1982, vol. 41, pp. 157-162.

Hagimura, et al, Impurity Dopig Effect On Electric Field Induced Strains In (Pb,Ba)(Zr,Tj)O3, pp. 185-188.

Tan et al., "Ferroelectric behaviours dominated by mobile and randomly quenched impurities in modified lead zirconate titanate ceramics", Philisophical Magazine B, 1997, vol. 76, No. 1, 59-74.

Imry, "Random-Field Instability of the Ordered State of Continuous Symmetry", Physical Review Letters, 1975, pp. 1399-41.

Uchino, Piezoelectric Actuators And Ultrasonic Motors, pp. 167-172.

Uchino, Ferroelectric Devices, pp. 64-66.

Viehland et al, Radom-field model for ferroelectric domain dynamics and polarization reversal, Journal Of Applied Physics, Dec. 1, 2000, pp. 6696-6707.

Kujvata et al, Ferroelectrics, Phase Transitions In The Pb(Zn1/3Nb2/3)O3-PbTiO3 system 1911, vol. 37, pp. 579-502 1981.

Park et al, Ultra~iigh strain and piezoelectric behavior in relaxor based ferroelectric single crystals, J. Appl. Phys. 82 (4), Aug. 15, 1997, pp. 1804-1811.

Viehland. Symmetry-adaptive ferroelectric mesostates in oriented Pb(Bl1/3Bll2/3)O3-PbTiO3 Crystals, Journal of Applied Physics, Oct. 2000, pp. 4794-4806.

Uchino et al., Drive Voltage Dependence of Electromechanical Resonance in PLZT Piezoelectric Ceramics, Japanese J. Appl. Physics Supplement 28-2, pp. 47-49, 1989.

Uchino et al., High Power Characterization of Piezoelectric Materials, Journal of Electroceramics 2:1, 33-40, 1998.

Chen et al, Mn-Modified Pb(Mgj,3Nb2j3)O3-PbTiO3 Ceramics: Improved Mechanical Quality Factors for High-Power Transducer Applications, Jpn. J. Appl. Phys. vol. 39 (2000) pp. 4843-4852, Part 1, No. 8, Aug. 2000.

Takahashi et al, Jpn. J. Appi. Phys. vol. 32 (1993) Pt. 1, No. 5B, pp. 2422-2425.

Jaffe et al, Piezoelectric Ceramics, pp. 100-106, 1971.

\* cited by examiner

IDT ELECTRODED PIEZOELECTRIC DIAPHRAGMS

This application claims priority to U.S. Provisional Application 60/525,632 filed Nov. 26, 2003.

FIELD OF THE INVENTION

The present invention relates to piezoelectric diaphragms and pumps such as pumps for the pumping of gases in solid state mass spectrometers as well as liquids such as liquid chromatography columns.

BACKGROUND OF THE INVENTION

Microelectromechanical systems (MEMS) are micromachined devices which include sensors or actuators together with signal processors. These devices are usually fabricated by integrated circuit techniques and have the potential for orders of magnitude decrease in size and cost. An example of MEMS is a micromachined mass spectrometer. A conventional mass spectrometer is large, heavy, and expensive. In addition, a trained technical person is required to operate it.

In order to miniaturize a mass spectrometer, a micromachined device capable of creating a vacuum of about 10 mTorr in a detector chamber of the mass spectrometer is required. This requirement, however, is not fully compatible with integrated circuit applications.

Diaphragms of the art which have been used in MEMS such as miniaturized pumps, when deflected in response to an applied voltage, typically undergo sharp, "witch hat" type deflections. Other diaphragms of the art also utilize high voltages when actuated by electrostatic fields only. These types of deflections are disadvantageous in that they generate high stresses in the diaphragm as well as inefficient pumping action.

A need therefore exists for diaphragms which may be used in, such as, miniature pumps and which address these disadvantages of the prior art.

SUMMARY OF THE INVENTION

Figure 1A:
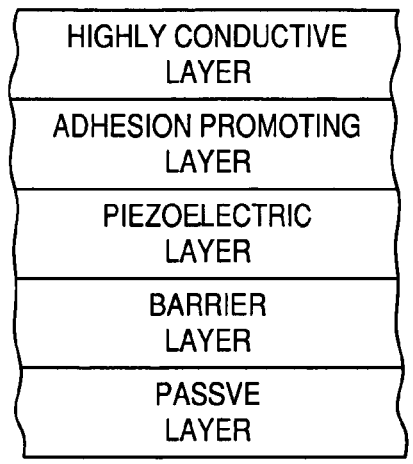
FIG. 1A is a side view of interdigitated electrode shown in FIG. 1.

The present invention achieves micron scale piezoelectric and antiferroelectric diaphragms. The diaphragms may be used in, such as, miniature piezoelectric diaphragm pumps. The miniature pumps may include a plurality of chambers to generate peristaltic pumping of fluids such as gases and liquids by sequential actuations of the diaphragms on one or more chambers of the pump. Other uses for the diaphragms include but are not limited to tunable filter elements, speakers and microphones, inkjet pumps, and hearing aids.

In a first embodiment, free standing diaphragms with interdigitated electrodes for actuation are produced. In this embodiment, a highly conductive metal such as Pt is deposited and patterned into an annular interdigitated electrode that has a central, inactive electrode free region.

In another embodiment, the piezoelectric diaphragm includes a central, inactive, electrode-free region and an annular shaped interdigitated electrode adjacent to the outer periphery of the central region. The central region may be inactive, or partially active such as active in an amount of up to about 10% of the diaphragm area. The diaphragms are actuated by the interdigitated electrodes. The central region may be free of the metal used to make the interdigitated electrode. Alternatively, the central region may include the metal used to form the annular interdigitated electrode. Preferably, the central region is free of the metal used to make the interdigitated electrode.

In yet another embodiment, the diaphragm may have an inactive annular, electrode free region and an active central, interdigitated electrode region. In this embodiment, the active central electrode region may occupy about 20% to about 95% of the diaphragm area. Also, in this embodiment, the annular electrode free region may be inactive, or alternatively, partially active. In this aspect, the partially active region may occupy up to all of the remaining area of the diaphragm. In this embodiment, the diaphragms are actuated by the central, interdigitated electrode. Also in this embodiment, the annular region may be free of the metal used to make the interdigitated electrode. Alternatively, the annular region may include the metal used to form the interdigitated electrode. Preferably, the annular region is free of the metal used to make the interdigitated electrode.

The piezoelectric diaphragm has an upper surface and a lower surface, and an annular region bordering a central region on the upper surface of the diaphragm. The annular region is in an active state when the central region is in an inactive state, and the annular region is in an inactive state when the central region is in an active state. The active state is present in any one of the annular region or central region when an interdigitated electrode is present in that region. The interdigitated electrode may include a composite metal layer that includes an adhesion promoting metal layer in contact with the piezoelectric layer and a highly conductive metal layer in contact with the adhesion promoting layer. Alternatively, the interdigitated electrode may include only a highly conductive metal such as Pt. When any of the annular or central regions are in an inactive state, that region may include the metal used to form the interdigitated electrode. Preferably, when any of the annular or central regions are in an inactive state, that region is free of the metal used to form the interdigitated electrode.

The invention also relates to a pump for peristaltic pumping of fluids wherein the piezoelectric diaphragms are employed. The pump includes a substrate that has a plurality of cavities and one or more interconnections between the cavities. Each of the cavities bears a diaphragm for displacement from its original shape to a deflected shape within the cavity in response to electrical voltage so as to displace fluid present in the cavity. The diaphragms may be used to generate uniform, micrometer scale displacements within one or more chambers of the pump. Upon termination of the applied voltage, the diaphragm returns to its original configuration. Sequential actuation of the diaphragms on one or more chambers of the pump generates peristaltic pumping. The pumps may be used in gas detection devices such as mass spectrometers. The miniature pumps may be used to pump gases at pressures as low as about 1 mTorr.

DETAILED DESCRIPTION OF THE INVENTION

Equipment

A Plasma Therm Corp. 720 machine (or comparable tool) may be used to perform reactive ion etching (RIE).

A Zygo Co. Interferometer (or comparable tool) may be used to measure the electric deflection of released piezoelectric diaphragms.

Manufacture of Free Standing Interdigitated Electrode Bearing Diaphragm

Released, free standing interdigitated electrode bearing diaphragms generally may be made by utilizing a silicon substrate. On the top surface of the substrate, a passive layer of a material such as silica is grown. A layer of a barrier material such as zirconia is formed over the silica layer. A piezoelectric layer such as PZT then is deposited over the zirconia layer. A layer of a highly conductive metal such as Pt is deposited over the piezoelectric layer. The layer of Pt then is patterned into an interdigitated electrode. The electrode may be in the form of an annular electrode which has a central inactive region. The central inactive region may include the Pt metal. Preferably, the central inactive region is free of the Pt metal.

Release of the diaphragm is achieved by application of the well known Deep Reactive Ion Etching (Bosch Process) to the bottom surface of the silicon substrate. Photolithography is used to form a suitable pattern that corresponds to the diameter of the diaphragm to be released. Deep reactive ion etching is employed to etch through the patterned silicon to reach the silica layer so as to release the diaphragm.

EXAMPLES 1-9

These examples illustrate formation of 800 micron diameter diaphragms which have a central, inactive electrode free region and an outer, annular active interdigitated electrode active region. The central inactive region is free of metal.

Example 1

A double-side polished four-inch diameter (100) silicon wafer has a 0.5 μm layer of $SiO_2$ thermally grown on the top surface of the wafer. A 0.3 μm thick layer of $ZrO_2$ then is deposited using a chemical solution deposition method. In this method, a 0.3 μm layer of zirconia is deposited over the layer of silica by using a 0.4 M zirconia solution that is prepared using 2-methoxyethanol (2-MOE) as the solvent. The zirconia solution is applied to the layer of silica and spun at 3000 rpm for 30 seconds. The spin coated layer is pyrolyzed at 300° C. and 450° C. for 60 seconds. The layer is crystallized by rapid thermal annealing at 700° C. for 60 seconds. Each $ZrO_2$ layer is 70 nm thick. To achieve a thickness of 0.3 μm, the spin coating and thermal processes are repeated. Finally, the zirconia layer is annealed at 700° C. for three hours.

A 2.0 μm thick layer of $Pb(Zr_{0.52}Ti_{0.48})O_3$ then is deposited over the $ZrO_2$ layer by a chemical solution deposition method. In this method, a solution of 0.75 M $Pb(Zr_{0.52}Ti_{0.48})O_3$ based on 2-methoxyethanol is used. The solution is applied and spun at 1500 rpm for 30 sec. The spin-coated layer is pyrolyzed at 300° C. and 450° C. for 60 sec. The layer is crystallized by rapid thermal annealing at 700° C. for 60 sec. Each layer is 0.2 μm thick. To get the thickness of 2.0 μm, the spin coating and thermal processes are repeated. A Pt (1000 angstrom) layer is then deposited on top of the $Pb(Zr_{0.52}Ti_{0.48})O_3$ film by sputtering. Reactive ion etching using a mixture of argon and chlorine is employed to pattern the Pt layer to produce an interdigitated annular electrode and a central, inactive electrode free region that is free of Pt. The IDT spacing and width are 5 μm and 10 μm, respectively.

The 800 μm diameter diaphragm structures are released by the well known Deep Silicon Reactive Ion Etching (Bosch process). The size of the diaphragm is 800 μm diameter and the coverage of annular IDT electrode is 85%. The diameter of the inactive circular electrode free region is 60μ. The diaphragm has the configuration shown in FIG. 1.

A voltage of 100V is applied to the diaphragm to cause it to generate a deflection. The deflection is measured statically by an interferometric profiler (Zygo, Inc.). Prior to application of the voltage, the diaphragm is poled at three times its coercive fields for 20 min at room temperature.

Example 2

The process of example 1 is followed except that the applied voltage is 140V.

Example 3

The process of example 1 is followed except that the applied voltage is 180V.

Example 4

The process of example 1 is followed except that the central electrode free region has a diameter of 150 micron.

Example 5

The process of example 1 is followed except that the central electrode free region has a diameter of 150 micron and the applied voltage is 140V.

Example 6

The process of example 1 is followed except that the central electrode free region has a diameter of 150 micron and the applied voltage is 180V.

Example 7

The process of example 1 is followed except that the central electrode free region has a diameter of 210 micron.

Example 8

The process of example 1 is followed except that the central electrode free region has a diameter of 210 micron and the applied voltage is 140V.

Example 9

The process of example 1 is followed except that the central electrode free region has a diameter of 210 micron and the applied voltage is 180V.

The results for examples 1-9 are shown in Table 1.

TABLE 1

Deflections v. Voltage (No Pt metal in central electrode free region)

| Ex. | Volts(V) | Annular diameter(um) of inactive region of diaphragm | Diameter of deflected diaphragm at bottom of deflection (um) | Diameter of deflected diaphragm at a depth of 3 um into the well of the deflection (um) | Maximum depth of vertical deflection(um) |
|---|---|---|---|---|---|
| 1 | 100 | 90 | 87 | 235 | 9.26 |
| 2 | 140 | 90 | 83 | 173 | 6.58 |
| 3 | 180 | 90 | 117 | — | 7.94 |
| 4 | 100 | 150 | 143 | 143 | 5.78 |
| 5 | 140 | 150 | 136 | 182 | 5.81 |
| 6 | 180 | 150 | 143 | 217 | 7.35 |
| 7 | 100 | 210 | 202 | 200 | 3.70 |
| 8 | 140 | 210 | 193 | — | 1.94 |
| 9 | 180 | 210 | 204 | 217 | 1.94 |

EXAMPLES 10-20

These examples illustrate formation of 800 micron diameter diaphragms which have an inactive, central electrode free region that includes Pt metal.

Example 10

The process of example 1 is followed except that the central electrode free region retains the Pt metal layer used to make the electrode.

Example 11

The process of example 10 is followed except that the applied voltage is 140V.

Example 12

The process of example 10 is followed except that the diameter of the central electrode free region is 90 micron.

Example 13

The process of example 10 is followed except that diameter of the central electrode free region is 90 micron and the applied voltage is 140V.

Example 14

The process of example 10 is followed except that diameter of the central electrode free region is 90 micron and the applied voltage is 180V.

Example 15

The process of example 10 is followed except that diameter of the central electrode free region is 150 micron.

Example 16

The process of example 10 is followed except that diameter of the central electrode free region is 150 micron and the applied voltage is 140V.

Example 17

The process of example 10 is followed except that diameter of the central electrode free region is 150 micron and the applied voltage is 180V.

Example 18

The process of example 10 is followed except that diameter of the central electrode free region is 210 micron.

Example 19

The process of example 10 is followed except that diameter of the central electrode free region is 210 micron and the applied voltage is 140V.

Example 20

The process of example 10 is followed except that diameter of the central electrode free region is 90 micron and the applied voltage is 180V.

The results are shown in Table 2.

TABLE 2

Deflections v. Voltage (Pt Metal in central, electrode free region)

| Ex. | Volts(V) | Annular diameter(um) of inactive region of diaphragm | Diameter of deflected diaphragm at bottom of deflection (um) | Diameter of deflected diaphragm at a depth of 3 um into the well of the deflection (um) | Maximum depth of vertical deflection(um) | Area (um$^2$)* |
|---|---|---|---|---|---|---|
| 10 | 100 | 60 | 61 | 84 | 4.50 | 838 |
| 11 | 140 | 60 | 59 | 178 | 5.93 | — |

TABLE 2-continued

Deflections v. Voltage (Pt Metal in central, electrode free region)

| Ex. | Volts(V) | Annular diameter(um) of inactive region of diaphragm | Diameter of deflected diaphragm at bottom of deflection (um) | Diameter of deflected diaphragm at a depth of 3 um into the well of the deflection (um) | Maximum depth of vertical deflection(um) | Area (um$^2$)* |
|---|---|---|---|---|---|---|
| 12 | 100 | 90 | 86 | 159 | 5.32 | 1016 |
| 13 | 140 | 90 | 92 | 222 | 7.85 | — |
| 14 | 180 | 90 | 97 | 249 | 8.30 | — |
| 15 | 100 | 150 | 145 | 145 | 3.55 | 728 |
| 16 | 140 | 150 | 86 | 189 | 7.41 | — |
| 17 | 180 | 150 | 97 | 249 | 8.30 | — |
| 18 | 100 | 210 | 195 | 195 | 2.95 | 759 |
| 19 | 140 | 210 | 81 | 200 | 4.81 | — |
| 20 | 180 | 210 | 54 | 238 | 6.52 | — |

*Area of contact by the diaphragm to the bottom of the well (chamber bottom) at maximum depth of vertical deflection is 3 um Manufacture of Diaphragm in Pump Manufacture of an interdigitated electrode bearing diaphragm in a pump such as a miniature pump generally entails forming a micron sized cavity in a substrate such as Si, depositing layers of passive and barrier materials in the cavity, followed by deposition of a piezoelectric layer. An interdigitated electrode then is formed on the piezoelectric layer to define active electrode regions and inactive, electrode free regions on the diaphragm.

Manufacture of a miniature pump that includes a micron sized piezoelectric diaphragm generally entails formation of a plurality of chambers and interconnecting channels between those chambers in a substrate such as Si, glass, and other semiconductor materials such as Ge, preferably Si. Useful glasses include but are not limited to fused quartz and Pyrex. An oxide is deposited in the chambers and interconnecting regions where the substrate is not presently an oxide. The chambers are then made planar with the original substrate surface by depositing a sacrificial layer of a material that is subsequently removed. The sacrificial layer may be any material whose etching chemistry is compatible with the other materials used in forming the diaphragm. The sacrificial layer preferably is amorphous silicon. Other sacrificial layer materials which may be used include amorphous germanium or other suitable materials which have compatible etching chemistry. The actuator then is formed over those chambers as generally described. However, the diaphragms are released according the procedure as described below.

The chambers, as well as interconnecting channels, may be formed in the substrate by processes such as reactive ion etching (RIE), wet chemical etching and ion milling, preferably RIE. RIE may be performed by reactive gases such as $SF_6$, $CF_4/O_2$ mixtures which have up to about 10% $O_2$ based on volume of $CF_4$, and $CF_4/H_2$ mixtures which have up to about 10% $H_2$ based on volume of $CF_4$. Preferably the reactive gas is $SF_6$. Typical flow rates of the reactive gases are about 1 sccm to about 100 sccm, preferably about 50 sccm. Typical pressures of the reactive gases are about 10 mTorr to about 250 mTorr, preferably about 100 mTorr.

A first layer of a material such as but not limited to $SiO_2$, $Si_3N_4$, $ZrO_2$ and $Al_2O_3$, or combinations thereof, preferably $SiO_2$, is deposited over the chambers and channels by processes such as reactive sputtering, thermal oxidation and chemical vapor deposition, preferably thermal oxidation. The thickness of the first layer may vary from about 0.5 microns to about 5.0 microns, preferably about 1.0 micron to about 2.5 microns. A layer of a sacrificial material then is applied over the first layer. Useful sacrificial materials include but are not limited to amorphous Si, crystalline Si, partially crystalline Si, amorphous Ge, metals such as Cu and Ni, and or combinations thereof, preferably amorphous Si. The thickness of the layer of sacrificial material may vary from about 2 micron to about 6 micron, preferably about 3 micron to about 5 micron. The sacrificial layer of Si is planarized using chemical-mechanical polishing. A passive material layer of an oxide such as but not limited to $SiO_2$ and $Al_2O_3$, or other materials such as $Si_3N_4$ and SiNx low stress $Si_3N_4$, or combinations thereof, preferably $SiO_2$ is deposited over the layer of sacrificial material. The thickness of the passive material layer may vary from about 0.2 micron to about 1.5 micron, preferably about 0.5 micron to about 0.7 micron. Alternatively, a protective layer of an additional material such as but not limited to $Al_2O_3$, $ZrO_2$, $Si_3N_4$ or combinations thereof may be deposited under the sacrificial layer of material prior to deposition of a passive layer of material such as $SiO_2$. When $Al_2O_3$ is employed, the $Al_2O_3$ may be deposited by sputtering. When $ZrO_2$ is employed, the $ZrO_2$ may be deposited by spin coating. When $Si_3N_4$ is employed, it may be deposited by low pressure chemical vapor deposition. The protective layer of additional material may vary in thickness from about 0.1 micron to about 0.5 microns, preferably about 0.25 microns. When a protective layer of additional material such as alumina is deposited, the passive layer of material such as silica is deposited onto the protective layer.

A layer of a barrier/growth orienting material such as but not limited to MgO, $Al_2O_3$, $ZrO_2$ or combinations thereof, preferably $ZrO_2$ is deposited over the passive material layer. The thickness of the layer of barrier material may vary from about 0.2 micron to about 0.5 micron, preferably about 0.3 micron to about 0.4 micron. A layer of a piezoelectric or electromechanically active material such as but not limited to Pb(Zr,Ti)$O_3$, $Pb_{0.52}Zr_{0.48}TiO_3$, PbZr$O_3$, PbTi$O_3$, Pb(Mg$_{1/3}$ Nb$_{2/3}$)$O_3$—PbTi$O_3$Pb(Yb$_{1/2}$Nb$_{1/2}$)$O_3$—PbTi$O_3$, ZnO, AlN or combinations thereof, preferably Pb(Zr,Ti)$O_3$, most preferably $Pb_{0.52}Zr_{0.48}TiO_3$ then is deposited over the layer of barrier material. The thickness of the piezoelectric material may vary from about 0.5 micron to about 5.0 micron, preferably about 1.5 micron to about 3.0 micron.

Figure 1:
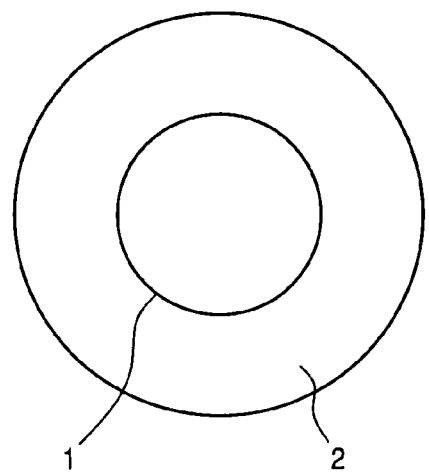
FIG. 1. is a schematic representation of a pie zoelectric diaphragm that has a central, electrode free region and an annular interdigitated electrode around the central region.

On top of the piezoelectric layer, an annular interdigitated electrode is patterned to enable the diaphragm to flex in response to an applied voltage. The electrode preferably is patterned to create on the surface of the piezoelectric layer an inner, electrode free region that is surrounded by an annular electrode as generally shown in FIG. 1 where 1 represents the central electrode free region and 2 represents the annular electrode region. In another aspect, the inner region may be made partially active in an area of up to about 10% of the diaphragm area by use of contiguous interdigitated electrode regions separated by rings of inactive electrode free material.

The annular electrode is formed on the piezoelectric layer by first depositing a thin film layer of an adhesion promoting metal such as Cr, Ta, Ti and W, preferably Cr, over the piezoelectric layer. The thickness of the adhesion promoting thin film metal layer may vary from about 0.01 micron to about 0.05 micron, preferably about 0.02 micron to about 0.03 micron. The adhesion promoting thin film layer typically covers the same area as the electrode layer. A layer of a highly conductive material such as Au, Pt, Al, or Ag, or combinations thereof, preferably Au, is deposited over the adhesion promoting layer to form a composite metal layer. The thickness of the highly conductive layer may vary from about 0.1 micron to about 0.5 micron, preferably about 0.2 micron to about 0.3 micron.

The resulting piezoelectric diaphragm stack then is subjected to a process such as reactive ion milling (RIE), wet chemical etching, preferably ion milling to generate portholes which extend from the surface of the stack to the underlying sacrificial material. The diameter of the portholes typically is about 100 microns to about 500 microns, preferably about 200 microns to about 300 microns. After having formed the portholes, the composite metal layer of, such as, Cr/Au, is patterned into an interdigitated electrode by photolithography. In this aspect, a mask material is deposited over the composite metal layer. The mask can be patterned to form an active interdigitated electrode on the outer portion of the diaphragm so as to form an interdigitated electrode that surrounds a central, electrode free region on the diaphragm. The width of the interdigitated electrodes may vary from about 1 micron to about 20 microns, preferably about 5 microns to about 7.5 microns. The spacing of the interdigitated electrodes may vary from about 1 micron to about 20 microns, preferably about 5 microns to about 7.5 microns.

Figure 2A:
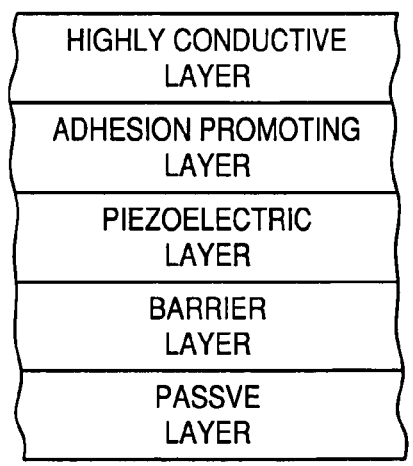
FIG. 2A is a side view of interdigitated electrode shown in FIG. 2.
Figure 2:
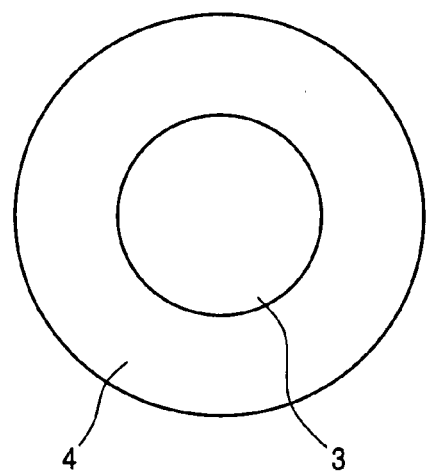
FIG. 2. is a schematic representation of diaphragm that has an annular, electrode free region that surrounds a central electrode region.

Photolithography also may be used to form a diaphragm that has an active central electrode region and a surrounding electrode free region such as is generally shown in FIG. 2 where 3 represents the inner electrode region and 4 represents the outer electrode free region. In this aspect, the central region may cover up to about 95% of the area of piezoelectric layer.

A reactive etchant such as $XeF_2$, $BrF_3$, $ClF_3$, or hydrogen peroxide/water solutions which have about 1 to about 15% hydrogen peroxide, based on total volume weight of the hydrogen peroxide/water solution, or mixtures thereof, preferably $XeF_2$, is passed through a porthole to remove the sacrificial layer so as to release the diaphragms. The released diaphragms are characterized for properties such as the form and extent of the deflection in response to an applied voltage.

EXAMPLES 21-23

These examples illustrate manufacture of an interdigitated electrode bearing diaphragm in a pump Example 21

A Si substrate is subjected to reactive ion etching (RIE) by use of $SF_6$ (50 sccm) at 200 mTorr at 200 W. RIE is used to etch five chambers which each have a diameter of 650 μm and a depth of 4.0 μm. This RIE process also is used to etch interconnections of 4.0 μm depth between the chambers as well as between the end surfaces of the substrate and the chambers. Then, a 1.2 μm thick passive layer of $SiO_2$ is grown in the wells of the chambers and the channels by thermal oxidation. A 0.25 micron thick protective layer of alumina then is sputtered onto the sacrificial layer of Si. A sacrificial layer of 5 μm thick amorphous silicon then is sputtered onto the protective layer of alumina.

A passive layer of 0.7 μm thick $SiO_2$ then is deposited on the layer of alumina. The passive layer of $SiO_2$ is deposited by (low temperature) chemical vapor deposition. A 0.3 μm barrier layer of $ZrO_2$ then is deposited over the 0.7 μm thick layer of $SiO_2$ by using a 2-methoxyethanol (2-MOE) based sol-gel method. In this method, a 0.4 M $ZrO_2$ solution is prepared using 2-methoxyethanol (2-MOE) as the solvent. Zirconia solution is applied on the wafers and spun at 3000 rpm for 30 sec. The spin-coated layer is pyrolyzed at 300 and 450° C. for 60 sec. The layer is crystallized by rapid thermal annealing at 700 oC for 60 sec. Each layer is 70 nm thick. To get the thickness of 0.3 μm, the spin coating and thermal processes are repeated. Finally, the $ZrO_2$ layer is annealed at 700° C. for 3 hours.

As PZT layer, a 2.0 μm thick layer of $Pb(Zr_{0.53}Ti_{0.47})O_3$ is deposited over the $ZrO_2$ layer by using the above described 2-methoxyethanol (2-MOE) based sol-gel method. In this method, a solution of 0.75 M $Pb(Zr_{0.53}Ti_{0.47})O_3$ based on 2-methoxyethanol is used. This solution is applied and spun at 1500 rpm for 30 sec. The spin-coated layer is pyrolyzed at 300 and 450° C. for 60 sec. The layer is crystallized by rapid thermal annealing at 700° C. for 60 sec. Each layer is 0.2 μm thick. To get the thickness of 2.0 μm, the spin coating and thermal processes are repeated.

On top of the $Pb(Zr_{0.52}Ti_{0.48})O_3$ layer, a 10 nm thick layer of Cr is deposited by e-beam evaporation. A 120 nm thick layer of Au then is deposited by e-beam evaporation over the layer of Cr to produce a composite Cr/Au metal layer.

The resulting diaphragm stack and pump preform that results from the above procedure is subjected to ion milling to form a 100 micron diameter port hole in each end of the preform. The port holes extend from the top surface of the diaphragm stack to the sacrificial layer of Si. A 4 μm thick layer of BCB4022 (Cyclotene resin, DOW Inc.) is utilized as the mask material and is baked on a hot plate for 2 hours at 200° C. After ion milling, the mask layer is removed by Nanostrip (Cyantek, Fremont, Calif.). Photolithography is used to pattern the Cr/Au composite layer into an annular interdigitated (IDT) electrode that surrounds a central electrode free region that is free of the Cr/Au composite layer. Both the width and spacing of the IDT electrodes are 7.5 μm. The central, electrode free region measures 90 microns in diameter. The configuration of the diaphragm is schematically shown in FIG. 1.

The diaphragms are released by using the Xetch system (XACTIX Inc) that employs $XeF_2$ and to produce a pump. The $XeF_2$ process is conducted using a Xetch tool machine (Xactix, Inc., Pittsburgh, Pa.). A pulse etching scheme is used. First, $XeF_2$ gas is introduced into the expansion chamber from the source chamber of the machine. When the expansion chamber reached the desired pressure, the charge is stopped. $XeF_2$ gas in the expansion chamber then is introduced into the etching chamber. The machine has two expansion chambers. After waiting for 15-25 seconds for the etching reaction, the etching chamber is evacuated to 10 mTorr to remove the by-products. This cycle is repeated until the pump structures are released.

The resulting pump that employs the released diaphragms has five interconnected cavities and a released, micron sized diaphragm over each of the cavities. The pump is capable of peristaltic pumping of fluids such as gases when the diaphragms are caused to deflect in response to applied voltage to the interdigitated electrode.

A voltage of 150 volts is applied to the diaphragm to cause it to generate a deflection. The deflection is measured as in example 1.

Example 22

The procedure of example 21 is followed except that the diameter of the electrode free region is 150 micron.

Example 23

The procedure of example 21 is followed except that the diameter of the electrode free region is 210 micron.

The results are shown in Table 3.

TABLE 3

Deflections v. Voltage (No Metal in central, electrode free region)

| Ex. No. | Voltage(V) | Annular diameter(μm) of inactive region of diaphragm | Width of deflection at Bottom of the deflection well (μm) | Maximum depth of Vertical deflection(μm) |
|---|---|---|---|---|
| 21 | 150 | 90 | 90 | 2.8 |
| 22 | 150 | 150 | 150 | 2.8 |
| 23 | 150 | 210 | 210 | 2.8 |

Example 24

This example illustrates manufacture of a diaphragm that has an electrode free annular region and a central region with an interdigitated electrode The method of example 21 is followed except that photolithography is used to form an outer, inactive annular electrode free region that measures 150 μm wide and a central, active interdigitated electrode region that measures 400 μm micron diameter. While the invention has been particularly shown and described with reference to preferred embodiments thereof, it will be understood by those skilled in the art that various alterations in form and detail may be made therein without departing from the spirit and scope of the invention.

The invention claimed is:

1. A piezoelectric diaphragm having an improved deflection in response to an applied voltage, the diaphragm comprising
   a first layer formed of any of a piezoelectric or antiferroelectric material, the first layer having an upper surface and a lower surface, the upper surface having an interdigitated electrode thereon to define an active annular electrode bearing region and a central, inactive electrode free region adjacent the annular electrode bearing region,
   the interdigitated electrode comprising a composite metal layer that includes an adhesion promoting metal layer and a highly conductive metal layer wherein the adhesion promoting metal layer is in contact with the upper surface of the first layer and the highly conductive metal layer is in contact with the adhesion promoting layer, and
   a barrier material in contact with the lower surface of the first layer and a passive material in contact with the barrier material.

2. The piezoelectric diaphragm of claim 1 wherein the piezoelectric material is selected from the group consisting of $Pb(Zr,Ti)O_3$, $PbZrO_3$, $PbTiO_3$, $Pb(Mg_{1/3}Nb_{2/3})O_3$—$PbTiO_3$, $Pb(Yb_{1/2}Nb_{1/2})O_3$—$PbTiO_3$, ZnO, AlN or combinations thereof.

3. The piezoelectric diaphragm of claim 1 wherein the piezoelectric material is $Pb\ Zr_{0.52}Ti_{0.48}O_3$.

4. The piezoelectric diaphragm of claim 3 wherein the adhesion promoting layer is Cr.

5. The piezoelectric diaphragm of claim 4 wherein the highly conductive metal layer is Au.

6. The piezoelectric diaphragm of claim 3 wherein the barrier layer is $ZrO_2$.

7. The piezoelectric diaphragm of claim 6 wherein the passive layer is $SiO_2$.

8. The piezoelectric diaphragm of claim 7 further comprising a layer of $Al_2O_3$ in contact with the layer of $SiO_2$.

9. The piezoelectric diaphragm of claim 1 wherein the adhesion promoting layer is selected from the group consisting of Cr, Ti, W and combinations thereof.

10. The piezoelectric diaphragm of claim 1 wherein the highly conductive metal layer is selected from the group consisting of Au, Pt and combinations thereof.

11. The piezoelectric diaphragm of claim 1 wherein the interdigitated electrode includes electrodes which have a width of about 1 micron to about 20 microns and a spacing between adjacent electrodes of about 1 microns to about 20 microns.

12. A piezoelectric diaphragm having an improved deflection in response to an applied voltage, the diaphragm comprising
   a first layer formed of any of a piezoelectric or antiferroelectric material, the first layer having an upper surface and a lower surface, the upper surface having an interdigitated electrode thereon to define an inactive annular electrode free region and a central, active electrode bearing region adjacent the annular electrode free region,
   the interdigitated electrode comprising a composite metal layer that includes an adhesion promoting metal layer and a highly conductive metal layer wherein the adhesion promoting metal layer is in contact with the upper surface of the first layer and the highly conductive metal layer is in contact with the adhesion promoting layer, and
   a barrier material in contact with the lower surface of the first layer and a passive material in contact with the barrier material.

13. The diaphragm of claim 12 wherein the piezoelectric layer is selected from the group consisting of $Pb(Zr,Ti)O_3$, $PbZrO_3$, $PbTiO_3$, $Pb(Mg_{1/3}Nb_{2/3})O_3$—$PbTiO_3$, $Pb(Yb_{1/2}Nb_{1/2})O_3$—$PbTiO_3$, ZnO, AlN or combinations thereof.

14. The diaphragm of claim 12 wherein the piezoelectric material is $Pb_{0.52}Zr_{0.48}TiO_3$.

15. The diaphragm of claim 14 wherein the adhesion promoting layer is Cr.

16. The piezoelectric diaphragm of claim 15 wherein the highly conductive metal layer is Au.

17. The piezoelectric diaphragm of claim 14 wherein the barrier layer is $ZrO_2$.

18. The piezoelectric diaphragm of claim 17 wherein the passive layer is SiO$_2$.

19. The diaphragm of claim 12 wherein the adhesion promoting layer is selected from the group consisting of Cr, Ti, W and combinations thereof.

20. The diaphragm of claim 12 wherein the highly conductive metal layer is selected from the group consisting of Au, Pt and combinations thereof.

21. The piezoelectric diaphragm of claim 12 wherein the interdigitated electrode region comprises electrodes having a width of about 1 micron to about 20 microns and a spacing between adjacent electrodes of about 1 microns to about 20 microns.

22. A pump for peristaltic pumping of fluids comprising,
   a substrate having a plurality of cavities and one or more interconnections between the cavities,
   one or more of the cavities bearing a diaphragm for displacement from its original shape to a deflected shape within the cavity in response to electrical voltage so as to displace fluid present in the cavity and which upon termination of the voltage the diaphragm returns to its original configuration,
   whereby sequential actuation of a diaphragm on one or more cavities of the pump generates peristaltic pumping wherein the diaphragm is a piezoelectric diaphragm according to any of claims 1-21.

23. A piezoelectric diaphragm having an improved deflection in response to an applied voltage, the diaphragm comprising
   a first layer formed of any of a piezoelectric material, the first layer having an upper surface and a lower surface, the upper surface having an interdigitated electrode thereon to define an inactive annular electrode free region and a central, active electrode bearing region adjacent the annular electrode free region,
   the interdigitated electrode comprising a highly conductive metal layer in contact with the upper surface of the first layer, and
   a barrier material in contact with the lower surface of the first layer and a passive material in contact with the barrier material.

24. A piezoelectric diaphragm having an improved deflection in response to an applied voltage, the diaphragm comprising
   a first layer formed of any of a piezoelectric material, the first layer having an upper surface and a lower surface, the upper surface having an interdigitated electrode thereon to define an active annular electrode bearing region and a central, inactive electrode free region adjacent the annular electrode bearing region,
   the interdigitated electrode comprising a highly conductive metal layer in contact with the upper surface of the first layer, and
   a barrier material in contact with the lower surface of the first layer and a passive material in contact with the barrier material.

* * * * *